United States Patent
Kondo et al.

(10) Patent No.: US 9,428,415 B2
(45) Date of Patent: Aug. 30, 2016

(54) GLASS AND MANUFACTURING METHOD OF GLASS PLATE

(71) Applicant: ASAHI GLASS COMPANY, LIMITED, Tokyo (JP)

(72) Inventors: Yuki Kondo, Tokyo (JP); Yuya Shimada, Tokyo (JP); Hiroyuki Hijiya, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 14/524,763

(22) Filed: Oct. 27, 2014

(65) Prior Publication Data

US 2015/0045202 A1 Feb. 12, 2015

Related U.S. Application Data

(63) Continuation of application No. PCT/JP2013/062497, filed on Apr. 26, 2013.

(30) Foreign Application Priority Data

Apr. 27, 2012 (JP) ................. 2012-104100

(51) Int. Cl.
- *C03C 3/095* (2006.01)
- *C03C 4/02* (2006.01)
- *H01L 31/0392* (2006.01)
- *H01L 31/048* (2014.01)

(52) U.S. Cl.
CPC ............... *C03C 3/095* (2013.01); *C03C 4/02* (2013.01); *H01L 31/0392* (2013.01); *H01L 31/048* (2013.01); *C03C 2204/00* (2013.01); *Y02E 10/50* (2013.01)

(58) Field of Classification Search
CPC .................................................. C03C 3/095
See application file for complete search history.

(56) References Cited

U.S. PATENT DOCUMENTS

| 5,264,400 A | 11/1993 | Nakaguchi et al. |
| 6,610,622 B1 | 8/2003 | Landa et al. |
| 7,037,869 B2 | 5/2006 | Landa et al. |
| 2006/0189472 A1 | 8/2006 | Longobardo et al. |
| 2012/0135851 A1 | 5/2012 | Okada et al. |
| 2014/0113141 A1* | 4/2014 | Yamamoto ............. C03C 3/085 428/410 |

FOREIGN PATENT DOCUMENTS

| JP | 5-97469 | 4/1993 |
| JP | 2002-160938 | 6/2002 |
| JP | 2010-275144 | 12/2010 |
| WO | 2011/019079 | 2/2011 |

OTHER PUBLICATIONS

International Search Report issued Jul. 16, 2013 in PCT/JP2013/062497 filed Apr. 26, 2013.

* cited by examiner

*Primary Examiner* — Karl Group
(74) *Attorney, Agent, or Firm* — Oblon, McClelland, Maier & Neustadt, L.L.P.

(57) ABSTRACT

To provide glass having a favorable color tone, and its production process.

Glass comprising, as represented by mass percentage based on oxides, at least 60% and at most 75% of $SiO_2$, at least 8% and at most 20% of $Na_2O$, at least 4.5% of MgO, at least 1% and at most 10% of CaO, and at least 0.01% and at most 0.5% of $Er_2O_3$.

13 Claims, 2 Drawing Sheets

GLASS AND MANUFACTURING METHOD OF GLASS PLATE

TECHNICAL FIELD

The present invention relates to glass having a favorable color tone and a manufacturing method of a glass plate.

BACKGROUND ART

Glass which is fairly clear in color, that is, which is light-colored and which has a high transmittance (for example, at least 75%) in the visible light region has been proposed (Patent Document 1).

PRIOR ART DOCUMENTS

Patent Documents

Patent Document 1: U.S. Pat. No. 7,037,869

DISCLOSURE OF INVENTION

Technical Problem

However, the glass as disclosed in Patent Document 1 has a low MgO content of 4.12% as disclosed in Examples, and is insufficient in the color tone.

The present invention is to make glass have an achromatic color tone or a slightly-bluish color tone by increasing the MgO content and by incorporating erbium oxide.

Solution to Problem

The glass of the present invention comprises, as represented by mass percentage based on oxides:
$SiO_2$: at least 60% and at most 75%,
$Na_2O$: at least 8% and at most 20%,
$MgO$: at least 4.5%,
$CaO$: at least 1% and at most 10%, and
$Er_2O_3$: at least 0.01% and at most 0.5%.

The glass of the present invention preferably comprises, as represented by mass percentage, at least 0.5% and at most 15% of $Al_2O_3$.

The glass of the present invention preferably comprises, as represented by mass percentage, at least 0% and at most 0.1% of total iron as calculated as $Fe_2O_3$.

The glass of the present invention preferably comprises, as represented by mass percentage based on oxides, at most 8% of CaO when the $SiO_2$ content is at least 70%, or above 8% of CaO when the $SiO_2$ content is less than 70%.

The glass of the present invention preferably comprises, as represented by mass percentage based on oxides, at least 4.5% and at most 15% of MgO.

Of the glass of the present invention, a Q value determined by the formula (MgO content/CaO content)×(CaO content+$Na_2O$ content−$Al_2O_3$ content) as represented by mass percentage based on oxides, is preferably at least 15.

Of the glass of the present invention, a ratio (MgO/CaO) of the MgO content to the CaO content is preferably at least 0.8 and at most 25.

The glass of the present invention preferably further comprises $SnO_2$.

The glass of the present invention preferably further comprises $SO_3$.

The glass of the present invention preferably further comprises $TiO_2$.

The manufacturing method of a glass plate of the present invention comprises:

preparing glass raw materials so that a glass plate after forming comprises, as represented by mass percentage based on oxides, at least 60% and at most 75% of $SiO_2$, at least 8% and at most 20% of $Na_2O$, at least 4.5% of MgO, at least 1% and at most 10% of CaO, and at least 0.01% and at most 0.5% of $Er_2O_3$;

melting the glass raw materials; and forming the molten glass materials by a float process, a downdraw process or a rollout process.

Advantageous Effects of Invention

The glass of the present invention has a color tone improved to an achromatic color or a slightly-bluish tone.

According to the manufacturing method of a glass plate of the present invention, a glass plate having a color tone improved to an achromatic color or a slightly-bluish tone can be produced.

DESCRIPTION OF EMBODIMENTS

Figure 1:
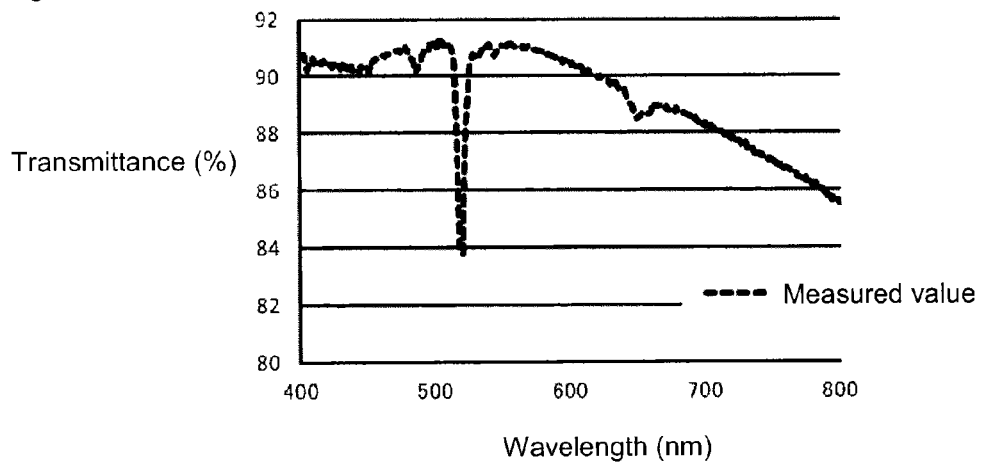
FIG. 1 is a graph illustrating the measured value of the spectral transmittance in Ex. 4.

Now, embodiments of the glass of the present invention will be described.

In this specification, unless otherwise specified, the mass percentage based on oxides will be referred to simply as %.

The glass according to the embodiment is a glass plate produced by a float process, a downdraw process or a rollout process.

The glass of the present invention is one which forms so-called soda lime silicate glass, which contains $SiO_2$ as the main component and further contains $Na_2O$, CaO and the like. Further, the glass contains erbium oxide. Erbium oxide is added to adjust a greenish tone of conventional glass to an achromatic color or a slightly-bluish tone which is generally preferred.

The glass comprises, as represented by mass percentage based on oxides:
$SiO_2$: at least 60% and at most 75%,
$Na_2O$: at least 8% and at most 20%,
$MgO$: at least 4.5%,
$CaO$: at least 1% and at most 10%, and
$Er_2O_3$: at least 0.01% and at most 0.5%.

$SiO_2$ is a glass network former and is essential. If the $SiO_2$ content is less than 60%, the glass stability tends to decrease. If the $SiO_2$ content exceeds 75%, the glass melting temperature tends to increase, and the glass may not be molten. The $SiO_2$ content is preferably at least 60%, more preferably at least 63%, particularly preferably at least 68%. On the other hand, it is preferably at most 75%, more preferably at most 74.5%, particularly preferably at most 74%.

$Na_2O$ is a component which accelerates melting of glass raw materials and is essential. If the $Na_2O$ content exceeds 20%, the weather resistance and the stability of the glass tend to be deteriorated. If it is less than 8%, the glass is hardly molten. The $Na_2O$ content is preferably at least 8%, more preferably at least 9%, particularly preferably at least 10%. On the other hand, it is preferably at most 20%, more preferably at most 18%, particularly preferably at most 17%.

MgO is a component which adjusts the absorption peak and is essential. If the MgO content is less than 4.5%, the absorption peak may not effectively be adjusted. If it exceeds 15%, the devitrification temperature may increase. The glass of the present invention contains a large amount of MgO as compared with soda lime silicate glass including conventional highly transparent glass. The MgO content is preferably at least 4.5%, more preferably at least 5%, particularly preferably at least 5.5%. On the other hand, it is preferably at most 15%, more preferably at most 14%, particularly preferably at most 13%.

By increasing the MgO content, the proportion of 6-coordinated $Fe^{2+}$ ion which has an absorption peak at a wavelength in the vicinity of 1,100 nm can be reduced, and the proportion of $Fe^{2+}$ ion which does not have an absorption peak at a wavelength in the vicinity of 1,100 nm can be increased. Accordingly, the same effect (that is, an effect to increase the solar transmittance (Te)) as that in a case where the mass proportion of the $Fe^{2+}$ ion as calculated as $Fe_2O_3$ (hereinafter referred to as Redox) to total iron as calculated as $Fe_2O_3$ is reduced, can be obtained.

CaO is a component which accelerates melting of glass raw materials and which adjusts the viscosity, the thermal expansion coefficient, etc. and at the same time a component which suppresses Redox, and is essential. If the CaO content exceeds 10%, the devitrification temperature tends to increase. The CaO content is preferably at least 1%, more preferably at least 1.5%, particularly preferably at least 2%. On the other hand, it is preferably at most 10%, more preferably at most 9%, particularly preferably at most 8%.

Further, it is preferred that the CaO content is lower than the MgO content. That is, the ratio (MgO/CaO) of the MgO content to the CaO content is preferably at least 0.8. Further, the ratio (MgO/CaO) is preferably at most 25, more preferably at most 11. This ratio (MgO/CaO) is more preferably at least 0.9 in the case of a glass composition having a content of total iron as calculated as $Fe_2O_3$ of at least 0.01% and at most 0.1%.

Further, the CaO content is preferably at most 8% when the $SiO_2$ content is at least 70%. On the other hand, the CaO content is preferably higher than 8% when the $SiO_2$ content is less than 70%. If it is out of such a range, the glass may be unstable.

$Er_2O_3$ is a component which adjusts the color tone and is essential. If the $Er_2O_3$ content is less than 0.01%, the color tone may not effectively be improved since the content is low. On the other hand, if the $Er_2O_3$ content exceeds 0.5%, the color tone may not effectively be improved since the content is too high. The $Er_2O_3$ content is preferably at least 0.01%, more preferably at least 0.015%, particularly preferably at least 0.02%. On the other hand, it is preferably at most 0.5%, more preferably at most 0.45%, particularly preferably at most 0.4%.

$Al_2O_3$ is a component which improves the weather resistance. When $Al_2O_3$ is contained, the weather resistance is improved and thus it is preferably contained, and when its content is at least 0.5%, the weather resistance tends to be favorable. The high temperature viscosity may be adjusted to improve the foam quality by properly increasing the $Al_2O_3$ content by the amounts of other components, however, if the $Al_2O_3$ content exceeds 15%, particularly if it exceeds 4.5%, the melting properties will remarkably be deteriorated. It is preferred that $Al_2O_3$ is contained, and its content is preferably higher than 0%, more preferably at least 0.5%, particularly preferably at least 0.7%. On the other hand, it is preferably at most 15%, more preferably at most 4.5%, further preferably at most 3.5%, particularly preferably at most 2.5%.

$B_2O_3$ is a component which accelerates melting of glass raw materials. If it is added to soda lime silicate glass, there are many disadvantages such as formation of ream by volatilization and corrosion of a furnace wall, and such is inappropriate in production. The $B_2O_3$ content is preferably at most 9%, more preferably at most 5%, further preferably at most 1%, and it is particularly preferred that substantially no $B_2O_3$ is contained. Here, "substantially no $B_2O_3$ is contained" means that it may be included in an amount at a level of impurities.

$K_2O$ is a component which accelerates melting of glass raw materials and adjusts the thermal expansion, the viscosity, etc. If the $K_2O$ content exceeds 5%, the weather resistance and the stability of the glass tend to be deteriorated. Further, if it exceeds 3%, the batch cost of the glass raw materials tends to increase. The $K_2O$ content is preferably at most 5%, more preferably at most 3%.

$ZrO_2$ is a component which improves the elastic modulus of glass. If the $ZrO_2$ content exceeds 3%, the melting properties will be deteriorated. The $ZrO_2$ content is preferably at most 3%.

$Fe_2O_3$ is a coloring component which is inevitably included in production. The content of total iron as calculated as $Fe_2O_3$ is preferably at least 0% and at most 0.1%. When it is at most 0.1%, a decrease in Tv can remarkably be suppressed. For a glass plate for a solar cell battery, a glass plate for a light collecting mirror and a glass plate for building materials such as window glass, from the viewpoint of the visible light transmittance (Tv) and the color tone, the content of the total iron as calculated as $Fe_2O_3$ is preferably as low as possible, for example, preferably at most 0.06%, more preferably at most 0.05%, further preferably at most 0.04%, particularly preferably at most 0.03%.

On the other hand, from the viewpoint of the effects obtainable by a predetermined composition, that is, effects such that a decrease in the visible light transmittance (Tv) and suppression of coloring are remarkably confirmed, the content of the total iron as calculated as $Fe_2O_3$ is preferably at least 0.005%, more preferably at least 0.007%.

In this specification, the content of the total iron is represented as the amount of $Fe_2O_3$ in accordance with a standard analysis method, however, not all the iron present in the glass is present as $Fe^{3+}$ ion. Usually, $Fe^{2+}$ ion is present in glass. The $Fe^{2+}$ ion has an absorption peak at a wavelength in the vicinity of 1,100 nm and has absorption also at a wavelength shorter than 800 nm, and the $Fe^{3+}$ ion has an absorption peak at a wavelength in the vicinity of 400 nm. An increase of the above absorption in the near infrared region at a wavelength of about 1,100 nm not only leads to a decrease in the solar transmittance (Te) but also leads to a decrease in the transmittance in the visible region (light at a wavelength shorter than 800 nm). Accordingly, reduction of the absorption coefficient of the $Fe^{2+}$ ion leads to an increase of the transmittance in the visible region as well as Te.

The glass may contain $SO_3$ used as a refiner. The content of the total sulfur as calculated as $SO_3$ is preferably from 0.05 to 0.5%. If the content of the total sulfur as calculated as $SO_3$ exceeds 0.5%, reboiling may occur during cooling of the molten glass, and the foam quality may be deteriorated. If the content of total sulfur as calculated as $SO_3$ is less than 0.05%, no sufficient refining effect will be obtained. The content of the total sulfur as calculated as $SO_3$ is preferably at least 0.05%, more preferably at least 0.1%. On the other hand, it is preferably at most 0.5%, more preferably at most 0.4%.

The glass may contain $SnO_2$ as an oxidizing/reducing agent. The content of total tin as calculated as $SnO_2$ is preferably at most 1%. Further, the glass may contain $Sb_2O_3$ used as a refiner. If the content of total antimony as calculated as $Sb_2O_3$ exceeds 0.5%, a glass plate after forming will be clouded. The content of the total antimony as calculated as $Sb_2O_3$ is preferably at most 0.5%, more preferably at most 0.1%.

By the above composition, highly transparent glass having an improved solar transmittance (Te) will be obtained. Further, by incorporating $Er_2O_3$, highly transparent glass having a color tone improved to an achromatic color or a slightly-bluish tone will be obtained. Particularly, since a large-sized production apparatus is used at a stage of mass production, it is not easy to specify the type of impurities which may cause a change in the color tone and a position of inclusion, and even if they can be specified, handling is not easy. However, by addition of $Er_2O_3$, the color tone can be improved regardless of the type of impurities, and only by its addition to a material powder, the color tone can be improved and further, the color tone can be finely adjusted by adjusting the addition amount. Thus, the present invention is readily applicable to mass production using a conventional large-sized production apparatus and can suppress a decrease in the productivity.

The above composition preferably satisfies a Q value determined by the following formula (1) of at least 15.

$$Q=(MgO/CaO)\times(CaO+Na_2O-Al_2O_3) \qquad (1)$$

In the above formula (1), (MgO/CaO) represents a value obtained by dividing the MgO content by the CaO content, and $(CaO+Na_2O-Al_2O_3)$ is a value obtained by subtracting the $Al_2O_3$ content from the sum of the CaO content and the $Na_2O$ content. That is, the Q value is a product of a value obtained by dividing the MgO content by the CaO content, and a value obtained by subtracting the $Al_2O_3$ content from the sum of the CaO content and the $Na_2O$ content.

A Q value of at least 15 means a composition not only having high MgO/CaO (a value obtained by dividing the MgO content by the CaO content) but also having a total content of CaO and $Na_2O$ quite higher than the $Al_2O_3$ content. By the total content of CaO and $Na_2O$ being higher than the $Al_2O_3$ content, iron which is present when the glass is molten is likely to be present as $Fe^{3+}$ ion, and the Redox can be suppressed without addition of an oxidizing agent. The Redox is not necessarily low since it influences the color tone, however, in order to increase Te and Tv, the Q value is more preferably at least 15. Further, it is preferably at most 150.

The glass of the present invention preferably contains substantially no CoO, $Cr_2O_3$, $V_2O_5$ and MnO which are coloring components. "Containing substantially no CoO, $Cr_2O_3$, $V_2O_5$ and MnO" means that CoO, $Cr_2O_3$, $V_2O_5$ and MnO are not contained at all, or CoO, $Cr_2O_3$, $V_2O_5$ and MnO may be contained as impurities which are inevitably included in production. When substantially no CoO, $Cr_2O_3$, $V_2O_5$ and MnO are contained, a decrease in the visible light transmittance (Tv) and the solar transmittance (Te) can be suppressed.

The solar transmittance (Te) of the glass is preferably at least 80%, more preferably at least 82.7%. The solar transmittance (Te) is a solar transmittance calculated by measuring the transmittance by a spectrophotometer in accordance with JIS R 3106 (1998) (hereinafter referred to simply as JIS R 3106). Further, when the content of $Fe_2O_3$ which is a coloring component in the composition is at most 0.01%, Te (as calculated as 4 mm thickness) is preferably at least 90%, more preferably at least 91%, further preferably at least 91.5%.

The visible light transmittance (Tv) (as calculated as 4 mm thickness) of the glass is preferably at least 80%, more preferably at least 82%. The visible light transmittance (Tv) is a visible light transmittance calculated by measuring the transmittance by a spectrophotometer in accordance with JIS R 3106. The coefficient is a value of the 2 degree field of view with illuminant A. Further, when the content of $Fe_2O_3$ which is a coloring component in the composition is at most 0.01%, the visible light transmittance (Tv) (as calculated as 4 mm thickness) is preferably at least 90%, more preferably at least 91%.

The glass is characterized in that a decrease of the solar transmittance (Te) can be suppressed even if $Fe^{2+}$ ion is present to a certain extent. Further, of the glass, the TI value represented by the following formula (2) is preferably at least 5, more preferably at least 7, further preferably at least 10.

$$TI=(Te-Te')/(\text{content of total iron as calculated as } Fe_2O_3) \qquad (2)$$

In the formula, Te is the solar transmittance (as calculated as 4 mm thickness) of a glass plate in accordance with JIS R 3106 (1998), and Te' is the solar transmittance (as calculated as 4 mm thickness) of conventional soda lime silicate glass having the same iron content as the glass plate of the present invention and having a mass proportion (Redox) of the $Fe^{2+}$ ion as calculated as $Fe_2O_3$ to the total iron as calculated as $Fe_2O_3$ at the same level as the glass of the present invention, as defined by the following formulae (3) to (5).

$$Te'=91.62645-12.0867\times A-323.051\times B \qquad (3)$$

$$A=(\text{content of total iron as calculated as } Fe_2O_3)\times (100-Re)\times 0.01 \qquad (4)$$

$$B=(\text{content of total iron as calculated as } Fe_2O_3)\times Re\times 0.01 \qquad (5)$$

In the above formulae, Re is Redox of glass as represented by percentage.

Further, glass when used for building materials such as window glass, is particularly preferred to have an achromatic color or a slightly-bluish tone. On the illuminant C basis calculated in accordance with JIS Z 8701-1999, the chromaticity coordinate corresponding to the achromatic color is (x, y)=(0.310, 0.316), and thus the glass preferably has an chromaticity coordinate within a range of (x, y)= (0.310±0.0012, 0.316±0.0012). For example, in the case of a 12 mm thick glass plate, in order that the chromaticity coordinate of the glass plate is within the above range, the content of erbium oxide is suitably adjusted. The glass more preferably has a chromaticity coordinate within a range of (x, y)=(0.310±0.001, 0.316±0.001), further preferably (x, y)=(0.310±0.008, 0.316±0.0008).

The glass of the present invention is suitable as a glass plate for a solar battery, a glass plate for a light collecting mirror, a glass plate for a window of a vehicle (an automobile, an aircraft or a train), a glass plate for a cover of an electronic device, or a glass plate for building materials such as a window glass. When the glass of the present invention is used as a glass plate for a solar battery, it may be used as a cover glass or may be used as a glass substrate for a thin film solar battery. Further, as a glass plate for a cover of an electronic device, it may be used as a solar cell, a portable audio player or a touch panel. Further, as a glass plate for building materials, it may be used for one for which beauty in appearance is required, such as an interior partition, glass for an indoor wall, an interior for a table or the like, stairs or a floor.

Further, the glass of the present invention may be used not only as the above glass plate but also as window glass bent to be used for a vehicle, or for building materials, as glass for which beauty in appearance is required, such as an interior partition curved by bending or glass for an indoor wall. Further, by being formed into a tube, it may be used as a lighting cover or glass for a lamp as an achromatic and highly transparent glass tube.

Further, the glass of the present invention when used as a glass plate may have a functional film depending upon the application formed on its surface. The functional film may, for example, be an antireflection film, a reflective film, an infrared absorption film, an anti-fogging film, a heat reflective film, an electrically conductive film, an alkali barrier film, an antistatic film or a Low-E film.

A glass plate using the glass of the present invention may be produced, for example, by the following steps (i) to (v) in order.

(i) Glass matrix composition raw materials including $Er_2O_3$, cullet, a refiner etc. are mixed to achieve the desired composition to prepare glass raw materials.

(ii) The glass raw materials are melted to obtain molten glass.

(iii) The molten glass is refined and then formed into a glass plate having a predetermined thickness by a float process, a downdraw process (such as a fusion process) or a rollout process.

(iv) The glass plate is cooled.

(v) The glass plate is cut into a predetermined size.

Step (i):

As the glass matrix composition raw materials, silica sand, feldspar and in addition, raw materials used as raw materials of conventional soda lime silicate glass may be mentioned. The refiner may, for example, be $SO_3$, $SnO_2$ or $Sb_2O_3$. On that occasion, the amount of addition of $Er_2O_3$ is adjusted so as to obtain a desired color tone. With respect to the amount of addition of $Er_2O_3$, for example, glass plates in which the amount of addition of $Er_2O_3$ is sequentially increased on trial are prepared, the relation between the amount of addition of $Er_2O_3$ and a change in the color tone is determined, and based on the relation, the optimum addition amount is determined. Further, at a stage of mass production using a large-sized production apparatus, the glass tends to have a greenish tone as compared with a glass plate produced on trial, and accordingly, for example, the amount of addition of $Er_2O_3$ is increased as compared with the relation determined on trial to achieve an achromatic color or a slightly-bluish tone.

Step (ii):

Melting of the glass raw materials is carried out, for example, by continuously supplying the glass raw materials to a melting furnace and heating them to 1,400° C. to 1,700° C. (for example, about 1,500° C.) e.g. by heavy oil, gas or electricity.

Steps (iii) to (v)

The forming step (iii), the cooling step (iv) and the cutting step (v) are carried out respectively by steps conducted in conventional production of a glass plate.

The above-described glass plate may have an improved solar transmittance (Te) and have a color tone improved to an achromatic color or a slightly-bluish tone, by achieving the predetermined composition. Further, when the Q value is at least 15, iron present at the time of melting glass is likely to be present as $Fe^{3+}$ ion, Redox is suppressed, and the solar transmittance (Te) tends to be high. Further, when the MgO content/CaO content is higher than 0.8, particularly than 1, the proportion of 6-coordinated $Fe^{2+}$ ion which has an absorption peak at a wavelength in the vicinity of 1,100 nm is reduced, the proportion of $Fe^{2+}$ ion which does not have an absorption peak at a wavelength in the vicinity of 1,100 nm is increased, and further the solar transmittance (Te) tends to be high. Thus, in the case of iron content at the same level as a conventional glass plate, the solar transmittance (Te) can be made higher than that of a conventional glass plate, and when the iron content is higher than that of a conventional glass plate, the solar transmittance (Te) at the same level as a conventional glass plate can be achieved.

Further, since sufficiently high Te can be obtained even when the iron content is relatively high, inexpensive glass raw materials can be used although the iron content is relatively high, and the production cost of a highly transparent glass plate is reduced. Further, even if the temperature of the molten glass when a highly transparent glass plate is produced by a float process, a downdraw process or a rollout process is high temperature at the same level as a case of producing a conventional glass plate by a float process, a downdraw process or a rollout process and if Redox (the proportion of $Fe^{2+}$ ion) is relatively high, the proportion of 6-coordinated $Fe^{2+}$ ion which has an absorption peak at a wavelength in the vicinity of 1,100 nm can be reduced and the proportion of $Fe^{2+}$ ion which does not have an absorption peak at a wavelength in the vicinity of 1,100 nm can be increased, and a highly transparent glass plate having a sufficiently high solar transmittance (Te) can be obtained. Thus, a high transparent glass plate can be produced with good productivity.

EXAMPLES

Now, the present invention will be described in detail with reference to Examples. However, it should be understood that the present invention is by no means restricted to such specific Examples. Ex. 1 to 24 are Examples of the glass of the present invention.

(Tv)

Of the obtained glass plate, the visible light transmittance (Tv) (by illuminant A) as specified by JIS R 3106 was obtained.

(Te)

Of the obtained glass plate, the solar transmittance (Te) as specified by JIS R 3106 was obtained.

Ex. 1 to 4

TABLE 1

|  | Ex. 1 | Ex. 2 | Ex. 3 | Ex. 4 |
| --- | --- | --- | --- | --- |
| $SiO_2$ | 71.8 | 71.8 | 71.8 | 71.8 |
| $Al_2O_3$ | 1.7 | 1.7 | 1.7 | 1.7 |
| $Na_2O$ | 14.8 | 14.8 | 14.8 | 14.8 |
| $K_2O$ |  |  |  |  |
| CaO | 4.8 | 4.8 | 4.8 | 4.8 |
| MgO | 6.9 | 6.9 | 6.9 | 6.9 |
| BaO |  |  |  |  |
| $SO_3$ | 0.4 | 0.2 | 0.2 | 0.2 |
| $Fe_2O_3$ | 0.012 | 0.015 | 0.012 | 0.018 |

TABLE 1-continued

|  | Ex. 1 | Ex. 2 | Ex. 3 | Ex. 4 |
|---|---|---|---|---|
| $TiO_2$ | 0.06 | 0.06 | 0.016 |  |
| $SnO_2$ | 0.05 | 0.035 | 0.05 | 0.09 |
| $Er_2O_3$ | 0.04 | 0.04 | 0.04 | 0.05 |
| MgO/CaO | 1.4 | 1.4 | 1.4 | 1.4 |
| Q value | 25.7 | 25.7 | 25.7 | 25.7 |
| Tv | 90.0 | 90.8 | 90.3 | 90.9 |
| Te | 88.9 | 89.3 | 86.8 | 89.2 |
| X | 0.3108 | 0.3105 | 0.31 | 0.31 |
| Y | 0.3165 | 0.3163 | 0.3163 | 0.3162 |

Silica sand and other various glass matrix composition raw materials commonly used for production of a glass plate, erbium oxide ($Er_2O_3$) and a refiner ($SO_3$) were mixed to achieve the glass composition as identified in Table 1 to prepare glass raw materials. The glass raw materials were put into a crucible and heated in an electric furnace at 1,450 to 1,600° C. for from 3 to 24 hours to obtain molten glass. The molten glass was cast on a carbon plate and cooled. Both the surfaces were polished to obtain a glass plate having a thickness of 12 mm.

Figure 2:
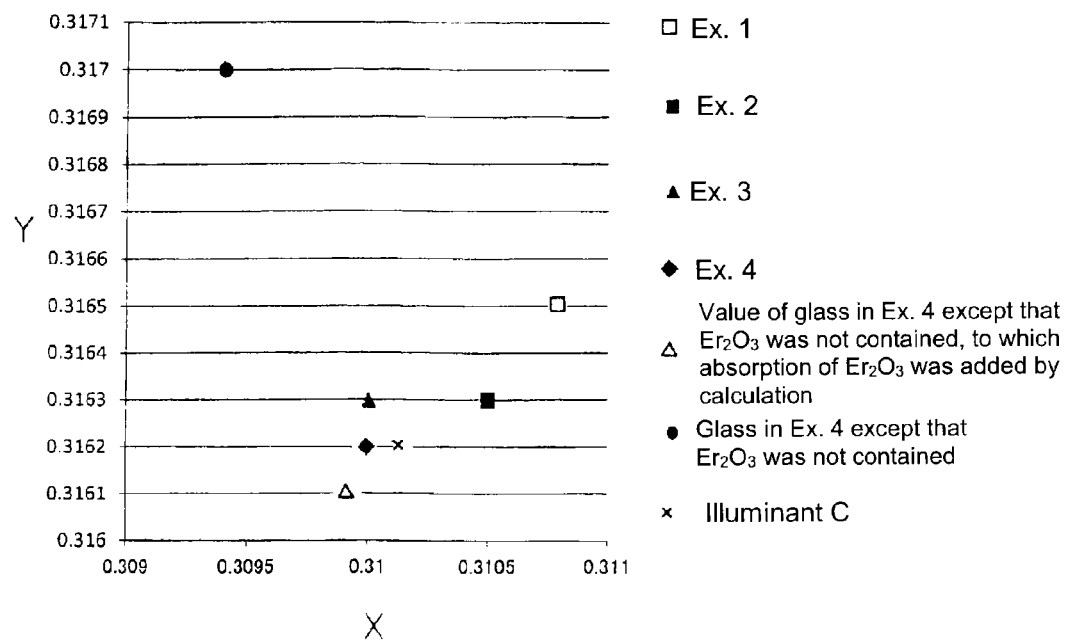
FIG. 2 is a graph illustrating the chromaticity distribution in Ex. 1 to 4.

Of the glass plate in Ex. 4 among the glass plates in Table 1, the transmittance was measured every 1 nm by a spectrophotometer (manufactured by Perkin Elmer, Lambda950). The results are shown in FIG. 1. Further, of the glass plates in Table 1, the chromaticity coordinates were obtained in accordance with JIS Z 8701-1999. The results are shown in FIG. 2. In FIG. 2, the symbol x represents an achromatic color on the illuminant C basis calculated in accordance with JIS Z 8701-1999. That is, the coordinate close to the symbol x means that the glass plate has an achromatic color. The square symbol (unfilled: □) represents the chromaticity coordinate in Ex. 1, the square symbol (filled: ■) the chromaticity coordinate in Ex. 2, the triangle symbol (filled: ▲) the chromaticity coordinate in Ex. 3, and the rhomboid symbol (filled: ♦) the chromaticity coordinate in Ex. 4. It is found from FIG. 2 that the chromaticity coordinates of all the glass plates in Table 1 are located in the vicinity of the chromaticity coordinate on the illuminant C basis. That is, all the glass plates in Table 1 have a more achromatic color.

In FIG. 2, the symbol Δ represents the chromaticity coordinate of glass in Ex. 4 except that $Er_2O_3$ was not contained, to which absorption of $Er_2O_3$ was added by calculation, and the circle symbol (filled: ●) represents the chromaticity coordinate of glass in Ex. 4 except that $Er_2O_3$ was not contained.

The data of the chromaticity coordinate X, Y in Table 1 and FIGS. 1 to 4 are values with respect to a glass plate having a plate thickness of 12 mm, and the data of Tv and Te in Table 1 and Tables 2 to 4 are values when the glass plate has a thickness of 4 mm.

As described above, it was found that by the glass comprising, as represented by mass percentage based on oxides, at least 60% and at most 75% of $SiO_2$, at least 8% and at most 20% of $Na_2O$, at least 4.5% of MgO, at least 1% and at most 10% of CaO and at least 0.01% and at most 0.5% of $Er_2O_3$, the chromaticity coordinate is closer to the chromaticity coordinate of an achromatic color on the illuminant C basis calculated in accordance with JIS Z8701-1999, and glass having an achromatic color which has never been achieved is obtained.

Figure 3:
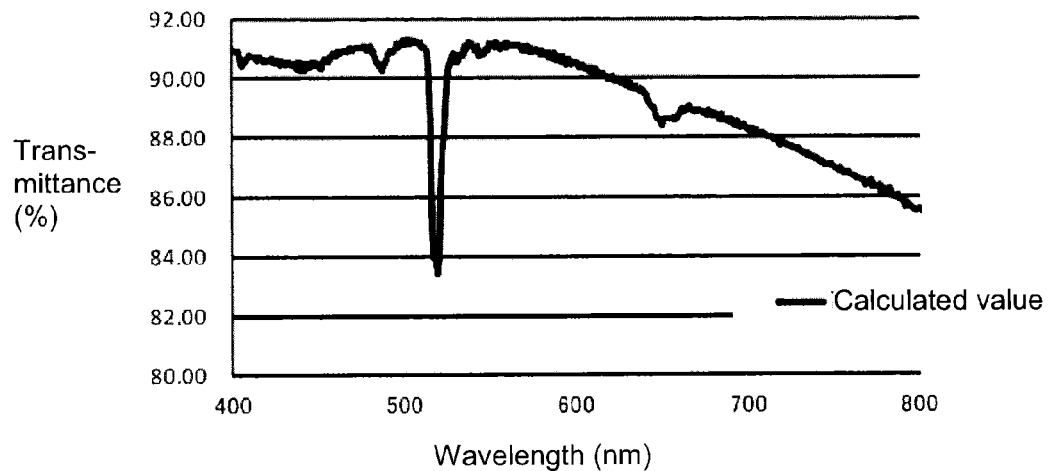
FIG. 3 is a graph illustrating the calculated value of the spectral transmittance in Ex. 4.
Figure 4:
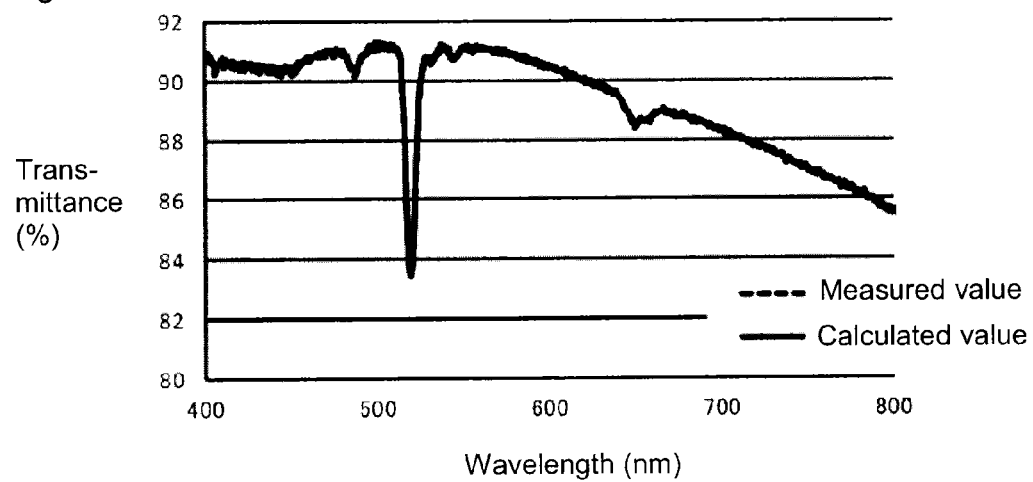
FIG. 4 is a graph illustrating both the measured value and the calculated value of the spectral transmittance in Ex. 4.

Further, of the glass in Ex. 4, the results of the transmittance obtained by calculation are shown in FIG. 3. For calculation, glass having a glass composition with the same amount of iron as the matrix composition and having 1,000 ppm of Er added was prepared, the absorbance was measured and a difference with the matrix glass was obtained to determine the spectrum of Er alone. This spectrum was added to the spectrum of the absorbance with respect to glass containing no Er, to obtain the transmittance. Further, both the results are shown in FIG. 4. As shown in FIG. 4, the solid line showing the calculated value and the dotted line showing the measured value agree with each other.

Ex. 5 to 43

Glass plates in Ex. 5 to 43 were prepared in the same manner as in Ex. 1 to 4 to achieve the glass compositions as identified in Tables 2 to 4. The values of Tv and Te of these glass plates are shown in Tables 2 to 4.

Comprehensively considering the findings obtained in Ex. 1 to 4 and the predictive calculation by the present inventors, the glass plates in Ex. 5 to 43 shown in the following Tables 2 to 4 are also estimated to have high Tv and an achromatic color in the same manner as in Ex. 1 to 4.

The data in Tables 2 to 4 are data with respect to a glass plate having a thickness of 4 mm, and Redox was obtained as follows.

The $Fe_2O_3$ amount in the obtained glass plate was the content (%: mass percentage) of total iron as calculated as $Fe_2O_3$ obtained by fluorescent X-ray measurement. The amount of $Fe^{2+}$ ion in the glass plate required for calculation of Redox was quantitatively determined by a wet analysis method. Specifically, the obtained glass plate was pulverized, and a solution of the obtained glass powder in HF, bipyridyl and an ammonium acetate solution were mixed to develop color, and the absorption peak intensity was measured, and the amount of the $Fe^{2+}$ ion was quantitatively determined based on an analytical curve preliminarily prepared using a standard solution.

TABLE 2

|  | Ex. 5 | Ex. 6 | Ex. 7 | Ex. 8 | Ex. 9 | Ex. 10 | Ex. 11 | Ex. 12 | Ex. 13 | Ex. 14 | Ex. 15 | Ex. 16 | Ex. 17 | Ex. 18 | Ex. 19 |
|---|---|---|---|---|---|---|---|---|---|---|---|---|---|---|---|
| $SiO_2$ | 72.6 | 71.5 | 66.5 | 67.5 | 61.8 | 62.7 | 72.2 | 70.7 | 70.9 | 70.9 | 71.1 | 69.9 | 65.8 | 61.9 | 71.6 |
| $Al_2O_3$ |  |  | 5.2 | 5.3 | 10.2 | 10.3 | 0.9 | 1.3 | 1.3 | 0.9 | 0.9 |  | 5.2 | 10.2 | 0.9 |
| $Na_2O$ | 11.0 | 14.1 | 16.9 | 10.7 | 16.5 | 13.6 | 14.9 | 15.9 | 15.9 | 15.9 | 15.9 | 17.0 | 13.6 | 10.3 | 14.8 |
| $K_2O$ |  |  |  |  |  |  |  |  |  |  |  |  |  |  |  |
| CaO | 2.2 | 3.7 | 1.5 | 4.3 | 3.0 | 1.8 | 4.8 | 5.7 | 4.8 | 5.8 | 4.8 | 7.7 | 9.0 | 10.3 | 7.6 |
| MgO | 14.2 | 10.7 | 9.9 | 12.3 | 8.6 | 11.6 | 7.3 | 6.4 | 7.1 | 6.5 | 7.3 | 5.5 | 6.5 | 7.4 | 5.1 |
| BaO |  |  |  |  |  |  |  |  |  |  |  |  |  |  |  |
| $SO_3$ |  |  |  |  |  |  |  |  |  |  |  |  |  |  |  |
| $Fe_2O_3$ | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |
| $TiO_2$ |  |  |  |  |  |  |  |  |  |  |  |  |  |  |  |
| $SnO_2$ |  |  |  |  |  |  |  |  |  |  |  |  |  |  |  |

TABLE 2-continued

|  | Ex. 5 | Ex. 6 | Ex. 7 | Ex. 8 | Ex. 9 | Ex. 10 | Ex. 11 | Ex. 12 | Ex. 13 | Ex. 14 | Ex. 15 | Ex. 16 | Ex. 17 | Ex. 18 | Ex. 19 |
|---|---|---|---|---|---|---|---|---|---|---|---|---|---|---|---|
| $Er_2O_3$ |  |  |  |  |  |  |  |  |  |  |  |  |  |  |  |
| Redox | 32.0 | 26.0 | 27.0 | 31.0 | 33.0 | 29.0 |  |  |  |  |  | 29.0 | 25.0 | 28.0 |  |
| MgO/CaO | 6.5 | 2.9 | 6.6 | 2.9 | 2.9 | 6.4 | 1.5 | 1.1 | 1.5 | 1.1 | 1.5 | 0.7 | 0.7 | 0.7 | 0.7 |
| Q | 85.0 | 51.0 | 85.0 | 28.0 | 27.0 | 33.0 | 28.0 | 22.0 | 29.0 | 24.0 | 30.0 | 18.0 | 13.0 | 7.0 | 15.0 |
| Tl | 30.0 | 13.0 | 13.0 | 29.0 | 31.0 | 22.0 |  |  |  |  |  | 3.0 | 1.0 | 7.0 |  |
| Tv | 89.8 | 89.8 | 89.6 | 89.8 | 89.6 | 89.6 | 90.0 | 89.8 | 89.8 | 89.7 | 89.9 | 89.5 | 89.6 | 89.4 | 89.4 |
| Te | 83.5 | 83.7 | 83.3 | 83.7 | 83.2 | 83.6 | 83.7 | 83.0 | 83.6 | 82.9 | 83.3 | 81.7 | 82.8 | 82.4 | 81.9 |

TABLE 3

|  | Ex. 20 | Ex. 21 | Ex. 22 | Ex. 23 | Ex. 24 | Ex. 25 | Ex. 26 | Ex. 27 | Ex. 28 | Ex. 29 | Ex. 30 | Ex. 31 | Ex. 32 | Ex. 33 | Ex. 34 |
|---|---|---|---|---|---|---|---|---|---|---|---|---|---|---|---|
| $SiO_2$ | 72.5 | 72.3 | 70.5 | 72.6 | 71.8 | 69.9 | 71.5 | 62.7 | 72.2 | 71.6 | 71.6 | 71.7 | 71.9 | 71.6 | 71.6 |
| $Al_2O_3$ | 1.0 | 1.0 | 1.3 | 1.8 | 1.7 | 1.8 |  | 10.3 | 0.9 | 1.0 | 0.9 | 1.0 | 1.0 | 0.8 | 1.0 |
| $Na_2O$ | 14.3 | 14.3 | 15.8 | 15.0 | 14.8 | 15.9 | 14.1 | 13.6 | 14.9 | 14.3 | 14.6 | 14.4 | 14.3 | 15.0 | 14.5 |
| $K_2O$ |  |  |  |  |  |  |  |  |  |  |  |  |  |  |  |
| CaO | 4.8 | 6.6 | 6.7 | 1.0 | 4.8 | 4.8 | 3.7 | 1.8 | 4.8 | 7.5 | 6.6 | 6.6 | 5.7 | 4.9 | 4.8 |
| MgO | 7.3 | 5.9 | 5.7 | 9.7 | 6.9 | 7.6 | 10.7 | 11.6 | 7.3 | 5.3 | 6.0 | 6.0 | 6.7 | 7.4 | 7.4 |
| BaO |  |  |  |  |  |  |  |  |  |  |  |  |  |  |  |
| $SO_3$ |  |  |  |  |  |  |  |  |  | 0.3 | 0.3 | 0.3 | 0.3 | 0.3 | 0.3 |
| $Fe_2O_3$ | 0.1 | 0.1 | 0.1 | 0.01 | 0.01 | 0.01 | 0.01 | 0.01 | 0.01 | 0.01 | 0.01 | 0.01 | 0.01 | 0.01 | 0.01 |
| $TiO_2$ |  |  |  |  |  |  |  |  |  | 0.002 | 0.001 | 0.001 | 0.001 | 0.001 | 0.001 |
| $SnO_2$ |  |  |  |  |  |  |  |  |  |  |  |  |  |  |  |
| $Er_2O_3$ |  |  |  |  |  |  |  |  |  | 17.1 | 16.9 | 16.6 | 16.0 | 16.3 | 15.7 |
| Redox |  |  |  |  |  |  |  |  |  |  |  |  |  |  |  |
| MgO/CaO | 1.5 | 0.9 | 0.9 | 9.7 | 1.4 | 1.6 | 2.9 | 6.4 | 1.5 | 0.7 | 0.9 | 0.9 | 1.2 | 1.5 | 1.5 |
| Q | 27.5 | 17.8 | 18.0 | 143.0 | 26.0 | 30.0 | 51.0 | 33.0 | 28.0 | 14.7 | 18.5 | 18.2 | 22.3 | 28.8 | 28.2 |
| Tl |  |  |  |  |  |  |  |  |  |  |  |  |  |  |  |
| Tv |  | 89.7 | 91.9 | 91.8 | 91.8 | 91.9 | 91.8 | 91.8 | 91.8 | 92.0 | 91.9 | 91.9 | 92.0 | 92.0 | 92.0 |
| Te |  | 82.3 | 91.6 | 91.6 | 91.6 | 91.5 | 91.5 | 91.6 | 91.5 | 91.6 | 91.5 | 91.6 | 91.6 | 91.6 | 91.5 |

TABLE 4

|  | Ex. 35 | Ex. 36 | Ex. 37 | Ex. 36 | Ex. 37 | Ex. 38 | Ex. 39 | Ex. 40 | Ex. 41 | Ex. 42 | Ex. 43 |
|---|---|---|---|---|---|---|---|---|---|---|---|
| $SiO_2$ | 73.1 | 73.4 | 71.6 | 71.6 | 71.6 | 71.6 | 71.6 | 71.6 | 71.6 | 71.6 | 71.6 |
| $Al_2O_3$ | 1.1 | 1.1 | 1.0 | 1.0 | 1.0 | 1.0 | 1.0 | 1.0 | 1.0 | 1.0 | 1.0 |
| $Na_2O$ | 14.5 | 14.5 | 14.3 | 14.3 | 14.3 | 14.3 | 14.3 | 14.3 | 14.3 | 14.3 | 14.3 |
| $K_2O$ |  |  |  |  |  |  |  |  |  |  |  |
| CaO | 1.9 | 0.5 | 7.5 | 7.5 | 7.5 | 7.5 | 7.5 | 7.5 | 7.5 | 7.5 | 7.5 |
| MgO | 9.4 | 10.5 | 5.3 | 5.3 | 5.3 | 5.3 | 5.3 | 5.3 | 5.3 | 5.3 | 5.3 |
| BaO |  |  |  |  |  |  |  |  |  |  |  |
| $SO_3$ | 0.2 | 0.2 |  |  |  |  |  |  |  |  |  |
| $Fe_2O_3$ | 0.01 | 0.01 | 0.01 | 0.01 | 0.01 | 0.01 | 0.01 | 0.05 | 0.05 | 0.05 | 0.02 |
| $TiO_2$ | 0.001 | 0.001 | 0.008 | 0.02 | 0.05 | 0.10 | 0.20 | 0.008 | 0.05 | 0.10 | 0.20 |
| $SnO_2$ |  |  |  |  |  |  |  |  |  |  |  |
| $Er_2O_3$ |  |  |  |  |  |  |  |  |  |  |  |
| Redox | 11.2 | 11.3 |  |  |  |  |  |  |  |  |  |
| MgO/CaO | 4.9 | 21.0 | 0.7 | 0.7 | 0.7 | 0.7 | 0.7 | 0.7 | 0.7 | 0.7 | 0.7 |
| Q | 75.7 | 291.9 | 14.7 | 14.7 | 14.7 | 14.7 | 14.7 | 14.7 | 14.7 | 14.7 | 14.7 |
| Tl |  |  |  |  |  |  |  |  |  |  |  |
| Tv | 92.1 | 92.2 | 92.0 | 92.0 | 91.9 | 91.9 | 91.7 | 91.4 | 91.4 | 91.4 | 91.8 |
| Te | 91.8 | 91.8 | 91.5 | 91.5 | 91.4 | 91.4 | 91.3 | 88.8 | 88.7 | 88.8 | 90.7 |

As evident from Table 1 and FIG. 2, the glass of the present invention approaches an achromatic color by addition of Er. In other words, the glass of the present invention approaches the illuminant C.

Further, as evident from Table 1 and FIG. 3, a spectrum with Er added can readily be estimated from Examples in which no Er is added, by obtaining a spectrum with Er added. Thus, it is found that the glasses in Ex. 5 to 43 also have the effect of the present invention such that they approach an achromatic color by addition of Er.

INDUSTRIAL APPLICABILITY

The glass of the present invention is suitable as a glass plate for a solar battery, a glass plate for a light collecting mirror, a glass plate for a window of a vehicle (an automobile, an aircraft or a train), a glass plate for a cover of an electronic device or a glass plate for building materials such as a window glass. When used as a glass plate for a solar battery, it may be used as a cover glass or may be used as a glass substrate for a thin film solar battery. Further, as a glass plate for a cover of an electronic device, it may be used as a solar cell or a portable audio player. Further, as a glass plate for building materials, it may be used for one for which beauty in appearance is required, such as an interior partition, glass for an indoor wall, an interior of a table or the like, stairs or a floor. Further, on the glass plate, an alkali barrier film or an electrically conductive film may be provided.

This application is a continuation of PCT Application No. PCT/JP2013/062497, filed on Apr. 26, 2013, which is based upon and claims the benefit of priority from Japanese Patent Application No. 2012-104100 filed on Apr. 27, 2012. The contents of those applications are incorporated herein by reference in their entireties.

What is claimed is:

1. Glass comprising, as represented by mass percentage based on oxides:
   $SiO_2$: at least 60% and at most 75%,
   $Na_2O$: at least 8% and at most 20%,
   MgO: at least 4.5%,
   CaO: at least 1% and at most 10%, and
   $Er_2O_3$: at least 0.01% and at most 0.5%,
   wherein a Q value determined by the formula (MgO content/CaO content)×(CaO content+$Na_2O$ content−$Al_2O_3$ content) as represented by mass percentage based on oxides, is at least 15.

2. The glass according to claim 1, wherein the glass further comprises, as represented by mass percentage based on oxides, at least 0.5% and at most 15% of $Al_2O_3$.

3. The glass according to claim 1, wherein the glass further comprises, as represented by mass percentage based on oxides, at least 0% and at most 0.1% of total iron as calculated as $Fe_2O_3$.

4. The glass according to claim 1, wherein the glass comprises, as represented by mass percentage based on oxides, at most 8% of CaO when the $SiO_2$ content is at least 70%, or above 8% of CaO when the $SiO_2$ content is less than 70%.

5. The glass according to claim 1, wherein the glass comprises, as represented by mass percentage based on oxides, at least 4.5% and at most 15% of MgO.

6. The glass according to claim 1, wherein a ratio (MgO/CaO) of the MgO content to the CaO content is at least 0.8 and at most 25.

7. The glass according to claim 1, wherein the glass further comprises $SO_3$.

8. The glass according to claim 1, wherein the glass further comprises $TiO_2$.

9. The glass according to claim 1, wherein the glass further comprises $SnO_2$.

10. A manufacturing method of a glass plate according to claim 1, wherein the manufacturing method comprises:
    preparing glass raw materials so that a glass plate after forming comprises, as represented by mass percentage based on oxides, at least 60% and at most 75% of $SiO_2$, at least 8% and at most 20% of $Na_2O$, at least 4.5% of MgO, at least 1% and at most 10% of CaO, and at least 0.01% and at most 0.5% of $Er_2O_3$;
    melting the glass raw materials; and
    forming the molten glass materials by a float process, a downdraw process or a rollout process,
    wherein a Q value determined by the formula (MgO content/CaO content)×(CaO content+$Na_2O$ content−$Al_2O_3$ content) as represented by mass percentage based on oxides, is at least 15.

11. The glass according to claim 1, wherein the glass has a Redox of less than 33.0%.

12. The glass according to claim 1, wherein the glass has a Redox of from 11.2 to 33.0%.

13. The glass according to claim 1, wherein a Q value determined by the formula (MgO content/CaO content)×(CaO content+$Na_2O$ content−$Al_2O_3$ content) as represented by mass percentage based on oxides, is at most 150.

* * * * *